US006606732B2

(12) United States Patent
Buffet et al.

(10) Patent No.: US 6,606,732 B2
(45) Date of Patent: Aug. 12, 2003

(54) METHOD FOR SPECIFYING, IDENTIFYING, SELECTING OR VERIFYING DIFFERENTIAL SIGNAL PAIRS ON IC PACKAGES

(75) Inventors: Patrick H. Buffet, Essex Junction, VT (US); Craig Lussier, Burlington, VT (US); Joseph Natonio, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 09/734,515

(22) Filed: Dec. 11, 2000

(65) Prior Publication Data

US 2002/0073384 A1 Jun. 13, 2002

(51) Int. Cl.[7] .............................................. G06F 17/50
(52) U.S. Cl. .................................. 716/4; 716/5; 716/10; 716/15
(58) Field of Search .............................. 716/1–6, 10–15

(56) References Cited

U.S. PATENT DOCUMENTS

| | | | |
|---|---|---|---|
| 4,009,437 A | 2/1977 | Lacher | 324/72.5 |
| 4,607,339 A | 8/1986 | Davis | 716/10 |
| 4,651,284 A | 3/1987 | Watanabe et al. | 716/8 |
| 4,742,471 A | 5/1988 | Yoffa et al. | 716/12 |
| 5,214,845 A * | 6/1993 | King et al. | 174/52.2 |
| 5,303,161 A | 4/1994 | Burns et al. | 716/9 |
| 5,311,443 A | 5/1994 | Crain et al. | 716/10 |
| 5,360,767 A | 11/1994 | Narayanan et al. | 716/12 |
| 5,375,069 A * | 12/1994 | Satoh et al. | 716/14 |
| 5,402,358 A | 3/1995 | Smith et al. | 716/9 |
| 5,519,632 A | 5/1996 | Chen et al. | 716/15 |
| 5,563,526 A | 10/1996 | Hastings et al. | 326/37 |
| 5,577,023 A | 11/1996 | Marum et al. | 370/225 |
| 5,648,912 A | 7/1997 | Narayanan et al. | 716/18 |
| 5,901,065 A | 5/1999 | Guruswamy et al. | 716/8 |
| 5,994,766 A | 11/1999 | Shenoy et al. | 257/659 |
| 6,035,111 A | 3/2000 | Suzuki et al. | 716/11 |
| 6,077,309 A * | 6/2000 | Lin | 716/14 |
| 6,349,402 B1 * | 2/2002 | Lin | 716/2 |
| 6,381,730 B1 * | 4/2002 | Chang et al. | 716/4 |

* cited by examiner

Primary Examiner—Matthew Smith
Assistant Examiner—Paul Dinh
(74) Attorney, Agent, or Firm—DeLio & Peterson, LLC; Robert Curcio; Richard M. Kotulak

(57) ABSTRACT

An automated method of selecting differential pairs in an integrated circuit comprising loading the design database for the integrated circuit package, and selecting output parameters for the differential pairs comprises adjacency criteria for the different pairs, time of flight tolerances for the differential pairs, and the redistribution layers and their voltage references. The method then includes comparing the output parameters to the design in the design database, and obtaining a resulting differential pairs list. The differential pair list preferably includes differential signal pairs having electrical characteristics within a predetermined design tolerance range. At least some of the differential signal pairs may comprise individual wires or connectors not physically adjacent one another.

17 Claims, 4 Drawing Sheets

METHOD FOR SPECIFYING, IDENTIFYING, SELECTING OR VERIFYING DIFFERENTIAL SIGNAL PAIRS ON IC PACKAGES

BACKGROUND OF THE INVENTION

1. Field of the Invention

This invention relates to the manufacturing of integrated circuits (ICs) on semiconductor wafers, and, in particular, to the design and configuration of signal wires for differential pairs on ICs.

2. Description of Related Art

In computer packages, limited interconnection resources are required to make connections to inputs and outputs on differential current switch (DCS) logic elements. The interconnection resources may be wiring pins, vias, wiring tracks or other interconnection resources that are limited in number or by physical or design restrictions. The limited resources must be assigned to respective requirements so as to globally optimize their use. DCS logic elements uses differential signal pairs to represent logic signals (i.e., 1 or 0) and requires two inputs for each basic logic switch. The DCS logic switch uses a pair of transistors that steer current in one of two directions to define the binary state of the switch, and has two inputs to each logic gate, connected to the bases of the two transistors. To change the state of the DCS logic element, one of the inputs is driven high and the other is simultaneously driven low.

When selecting signal wires for differential pairs on IC packages, a number of criteria need to be considered, among them, adjacency of controlled collapsed chip connections (C4s) or wire bond pads which electrically connect individual chips in a multichip module (MCM) or package, adjacency of electrically connecting pins, balls or columns which connect the MCM or package to a substrate, and adjacency of package redistribution wires and vias in the package substrate. Additional criteria include the closeness of total wire length, resistance, inductance, capacitance, and time of flight (IRLCTf) values (i.e., time for a signal to pass from one end of a wiring net to the other), identicalness of in-MLC redistribution layers for the escape wires, and specific voltage references of the redistribution layers for the escape wire. Differential in-package wire pairs become important as there are more and more "differential signals".

Currently, differential wire pairs are not clearly specified. It is up to the designer to first define what it means by 'adjacency', 'closeness', 'identicalness' and 'specific' in the above criteria, and then search, by hand, for possible nets that could be considered differential wire pairs. The definition of 'adjacency', 'closeness', 'identicalness' and 'specific' may be different depending on the stringency placed on the design. Also, there is no tool that checks that the differential pairs selected are legal differential pairs, according to the criteria.

Bearing in mind the problems and deficiencies of the prior art, it is therefore an object of the present invention to provide an improved method of selecting differential pairs in computer packages incorporating differential switch logic elements.

It is another object of the present invention to provide a method of automating the design of differential wire pairs in integrated circuit packages.

It is a further object of the present invention to provide a method of standardizing criteria for specifying, identifying, selecting and verifying differential signal pairs on IC packages.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an automated method of selecting differential pairs in an integrated circuit comprising loading the design database for the integrated circuit package, and selecting output parameters for the differential pairs comprising adjacency criteria for the different pairs, time of flight tolerances for the differential pairs, and the redistribution layers and their voltage references. The method then includes comparing the output parameters to the design in the design database, and obtaining a resulting differential pairs list. The differential pair list preferably includes differential signal pairs having electrical characteristics within a predetermined design tolerance range. At least some of the differential signal pairs may comprise individual wires or connectors not physically adjacent one another.

The differential pair list may include bundles of differential signal pairs having electrical characteristics within a predetermined design tolerance range, and at least some of the differential signal pairs in the bundles may be differential signal pairs not physically adjacent one another. The differential pair list may include groups of differential signal pairs having electrical characteristics within a predetermined design tolerance range, and at least some of the differential signal pairs in the groups may be bundles of differential signal pairs not physically adjacent one another. The method may further include obtaining a table of resistance, inductance and capacitance values of each differential signal pair.

In another aspect, the present invention provides a system for selecting differential pairs in an integrated circuit comprising means for loading the design database for the integrated circuit package, and means for selecting output parameters for the differential pairs comprising adjacency criteria for the different pairs, time of flight tolerances for the differential pairs, and the redistribution layers and their voltage references. The system also includes means for comparing the output parameters to the design in the design database, and means for obtaining a resulting differential pairs list.

In a further aspect, the present invention relates to an article of manufacture comprising a computer usable medium having computer readable program code means embodied therein for selecting differential pairs in an integrated circuit. The article comprises computer readable program code means for loading the design database for the integrated circuit package, and computer readable program code means for selecting output parameters for the differential pairs comprising adjacency criteria for the different pairs, time of flight tolerances for the differential pairs, and the redistribution layers and their voltage references. The article further includes computer readable program code means for comparing the output parameters to the design in the design database, and computer readable program code means for obtaining a resulting differential pairs list.

Another aspect of the present invention relates to a program storage device readable by a machine, tangibly embodying a program of instructions executable by the machine to perform method steps for selecting differential pairs in an integrated circuit. The method steps comprise loading the design database for the integrated circuit package, and selecting output parameters for the differential pairs comprising adjacency criteria for the different pairs, time of flight tolerances for the differential pairs, and the redistribution layers and their voltage references. The method then includes comparing the output parameters to the design in the design database, and obtaining a resulting differential pairs list.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS

Figure 1:
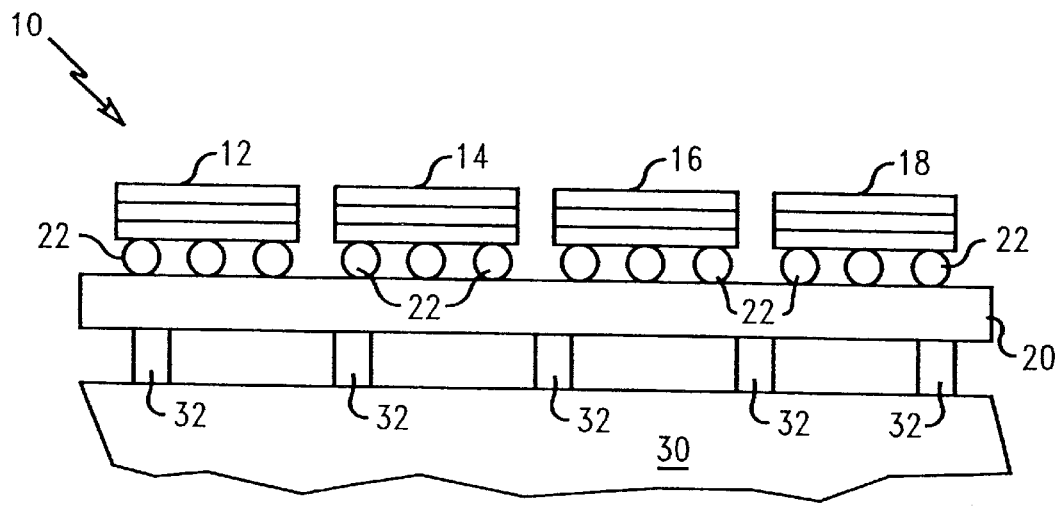
FIG. 1 is an elevational view of a cross-section of a multichip module (MCM).

In describing the preferred embodiment of the present invention, reference will be made herein to FIGS. 1–7 of the drawings in which like numerals refer to like features of the invention. Features of the invention are not necessarily shown to scale in the drawings.

This invention gives a method for specifying, identifying, selecting, or checking differential pairs in an automated way by using package wiring information along with the definitions of adjacent controlled collapsed chip connections (C4s), e.g., solder balls, or wire bond pads, adjacent package pins, balls or columns, adjacent redistribution wires, adjacent vias, close IRLCTfs, identical redistribution layers and looks at the redistribution layers voltage references.

The method of the present invention is able to form 'bundles' of differential pairs with specified characteristics, 'groups' of bundles of pairs with specified characteristics, and 'supersets' or 'subsets' of bundles of groups with specified characteristics. In particular, the present invention solves the aforementioned problems of differential pair selection in an automated way by allowing the designer to specify adjacency criteria, a window for close IRLCTf values, as well as considers the layers on which possible differential pairs are wired.

The present invention improves differential wire pair selection not only by automating C4 adjacency, package pin adjacency, and IRLCTf values, which have been manually done in the past in one manner or another, but also by including the selection of differential wire pairs according to the redistribution layers, as well as using crosstalk values to determine redistribution wire adjacency. This invention also improves on prior art methods by the ability to form bundles, groups and supersets or subsets as defined above.

The preferred embodiment employs the following parameters:

Adjacency of chip C4s or wire bond pads may be specified as a distance between C4s or wire bond pads. The distance can be represented by one or by several numbers or attributes, each, with its own specification. The numbers or attributes describing the distance can be geometric patterns, units of length, angle, electrical, non-dimensional or others. Preferably, x- and y-coordinates of the chip C4s or wire bond pads may be used to determine distance.

Adjacency of package pins, balls or columns, may be specified as a distance between package pins, balls or columns, and can be represented by one or by several numbers or attributes, each with its own specification. The numbers or attributes describing the distance can be geometric patterns, units of length, angle, electrical, non-dimensional or others. Preferably, x- and y-coordinates of the package pins, balls or columns may be used to determine distance.

Adjacency of package redistribution wires may be specified as a distance between redistribution wires. The distance can be represented by one or by several numbers or attributes, each with its own specification. The numbers or attributes describing the distance can be geometric patterns, units of length, angle, electrical, non-dimensional or others. This may be determined, for example, by any well known crosstalk test, which compares noise between wires, and if one wire puts on to another wire more noise than any other wire, then the two wires are considered closest or most adjacent.

Adjacency of package vias may be specified as a distance between vias. The distance can be represented by one or by several numbers or attributes describing the distance can be geometric patterns, units of length, angle, electrical, non-dimensional, or others.

The wire total length, resistance, inductance, capacitance, and time of flight (IRLCTf) value match may be specified as a tolerance. The tolerance can be represented by one or by several numbers or attributes, each with its own specification. The numbers or attributes describing the tolerance can be units of length, angle, electrical, non-dimensional or others.

The usage of the redistribution layers by the wire escapes in the package is represented by a set of numbers or attributes, absolute and relative. The information verifies that the usage complies with the specification.

Specified ground or voltage references are determined for the redistribution layers of the wire escapes in the package. For a wire pair to be considered a differential pair, it may need to be sandwiched between ground and a specific voltage supply. For example, the differential pair may need to be between a GND layer and a VDD2 layer.

Referring to FIG. 1, a multichip module 10 is comprised of a plurality of individual multilayer chips 12, 14, 16 and 18 electrically connected to a multilayer chip package 20. The electrical connections 22 between the chips and the package may be by C4s or by wire bond pads, or by any other suitable electrical connection. Package 20 contains wiring (discussed further below) that provides desired electrical interconnection among chips 12, 14, 16 and 18, and from the package to a substrate 30, below. The electrical connections 32 between the package and the substrate may be by otherwise conventional package pins, balls or columns, or any other suitable electrical connection.

Figure 2:
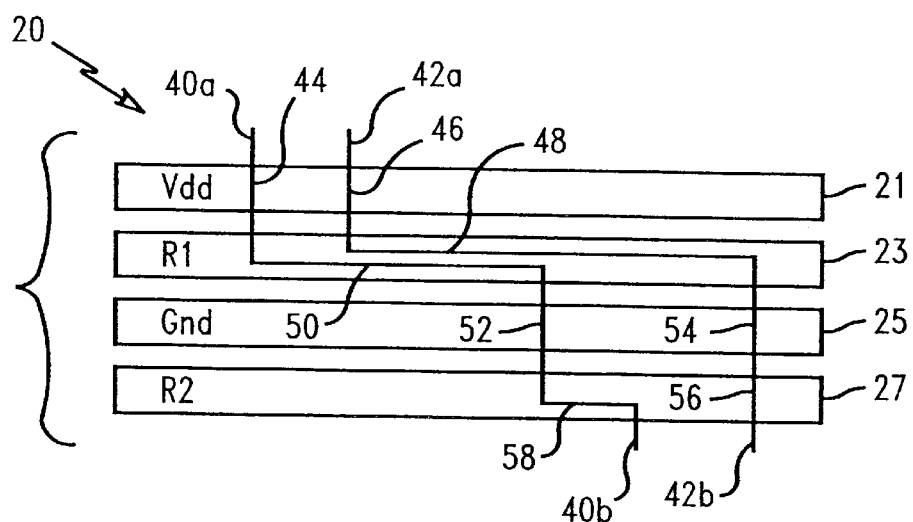
FIG. 2 is an elevational view of a partially exploded cross-section of the package portion of the MCM of FIG. 1.

Within package 20 there are electrical connections or nets which pass through, along and between different thin film and/or glass ceramic layers 21, 23, 25, 27 of the package, as shown in simplified form in FIG. 2. Package layer 21 carries the voltage connection VDD, and package layer 25 carries the ground GND connection. Resistance layers R1, 23, and R2, 27, insulate the current carrying layers. The vertical electrical connections in package 20 are referred to as the package vias, and the horizontal connections are referred to as the package redistribution wires. For example, the electrical connection of wire end 40a, which may be connected to a C4, proceeds through via 44, redistribution wire 50, via 52, and redistribution wire 58, to wire end 40b, which may be connected to a package pin. Likewise, the electrical connection of wire end 42a proceeds through via 46, redistribution wire 48, and vias 54 and 56 to wire end 42b.

Figure 3:
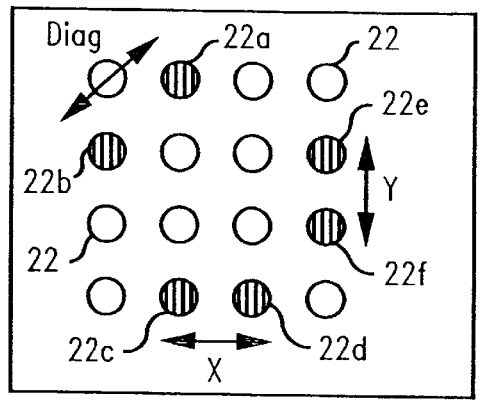
FIG. 3 is a top plan view of a C4 layer of connection between the chip and package of FIG. 1.
Figure 4:
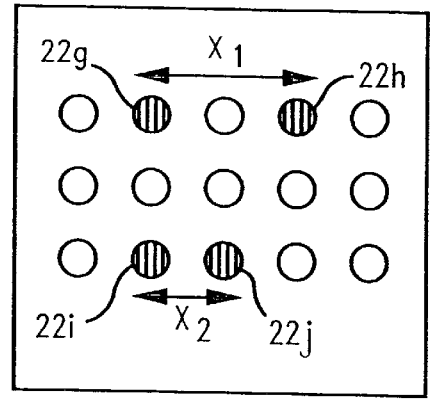
FIG. 4 is a top plan view of the C4 connection layer showing the determination of wire distance.

Using a C4 connection layer as an example, FIG. 3 shows the determination of adjacency between C4 connections. Adjacency between C4 connections 22a, 22b, 22c and 22d may be determined by X-, Y- and diagonal relationships. Connections 22a and 22b, 22c and 22d, and 22e and 22f are all considered to be most adjacent. Once this is done, FIG. 4 shows the distance values assigned between pairs of C4s. For example, a distance $X_1$ is shown between C4s 22g and 22h, and a distance $X_2$ is shown between C4s 22i and 22j. Similarly, adjacency between pairs of package pins, balls or columns, and package vias, may be determined in a similar manner. For adjacency of package redistribution wires, both physical distance and crosstalk may be considered.

Figure 5:
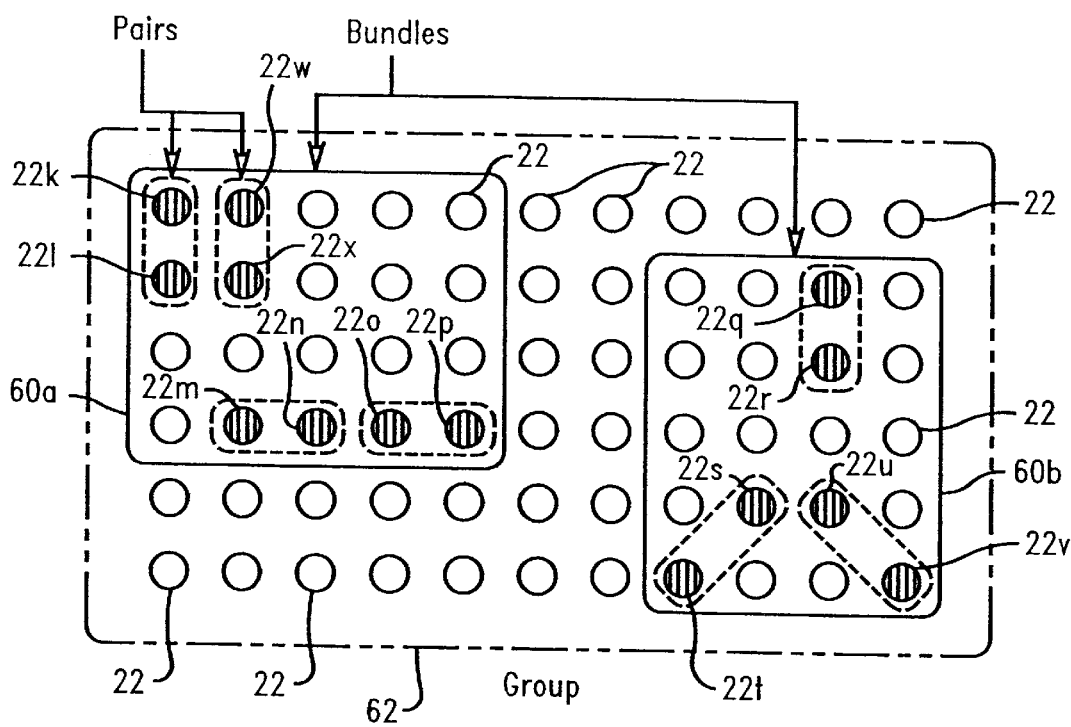
FIG. 5 is a top plan view of the C4 connection layer showing the determination of differential wire pairs, differential wire bundles, and differential wire groups.

To select a desired differential pair, two nets between the C4 connection and the package ball, including all the wiring between them in the package, should be selected so that they both appear to be most electrically identical. This means that signals starting at one end of the net appear at the other end of the net at the same time and should be exposed to the same electrical environment, such as noise effects. Ideally, the wiring of the two nets will be directly adjacent each other throughout the net, since signals passing through both nets will be affected in the same manner. The differential driver circuit will then reject common noise between the wiring in the differential pair. This results in the optimum and maximum high/low, 1/0 logic signal to operate other logic devices. FIG. 5 shows the identification of desired differential signal pairs 22k and 22l, 22m and 22n, 22o and 22p, 22q and 22r, 22s and 22t, 22u and 22v, and 22w and 22x.

In using several differential receivers or logic devices, it may be useful to have more than one differential signal pairs which have similar characteristics so that they all switch at the same time. FIG. 5 also shows the identification and grouping of several differential signal pairs into differential signal bundles, and several differential signal bundles into a differential signal group. Differential signal bundle 60a consists of differential pairs 22k and 22l, 22m and 22n, 22o and 22p, and 22w and 22x. Differential signal bundle 60b consists of differential pairs 22q and 22r, 22s and 22t, and 22u and 22v. Each differential signal bundle represents differential signal pairs having characteristics within a predetermined range, so as to be most similar. These identified differential signal pairs in bundles 60a, 60b are further organized into differential signal group 62, which represents another level or similarity of electrical characteristics of the differential signal pairs. The differential signal pairs in the bundles and groups may be assigned to carry logic signals to desired differential signal-receiving logic devices according to their similarity of electrical characteristics, and may be distinguished from other nets on the package which have more electrical differences. The differential pairs in each identified differential bundle and differential group may be (and probably will be) physically separated from at least one other pair, by different connections, wires, and vias in other nets. If ideal adjacency is not achieved, the individual connections, wires, and vias in each net making up a differential pair may also be physically separated from each other by other connections, wires, and vias in other nets.

Figure 6:
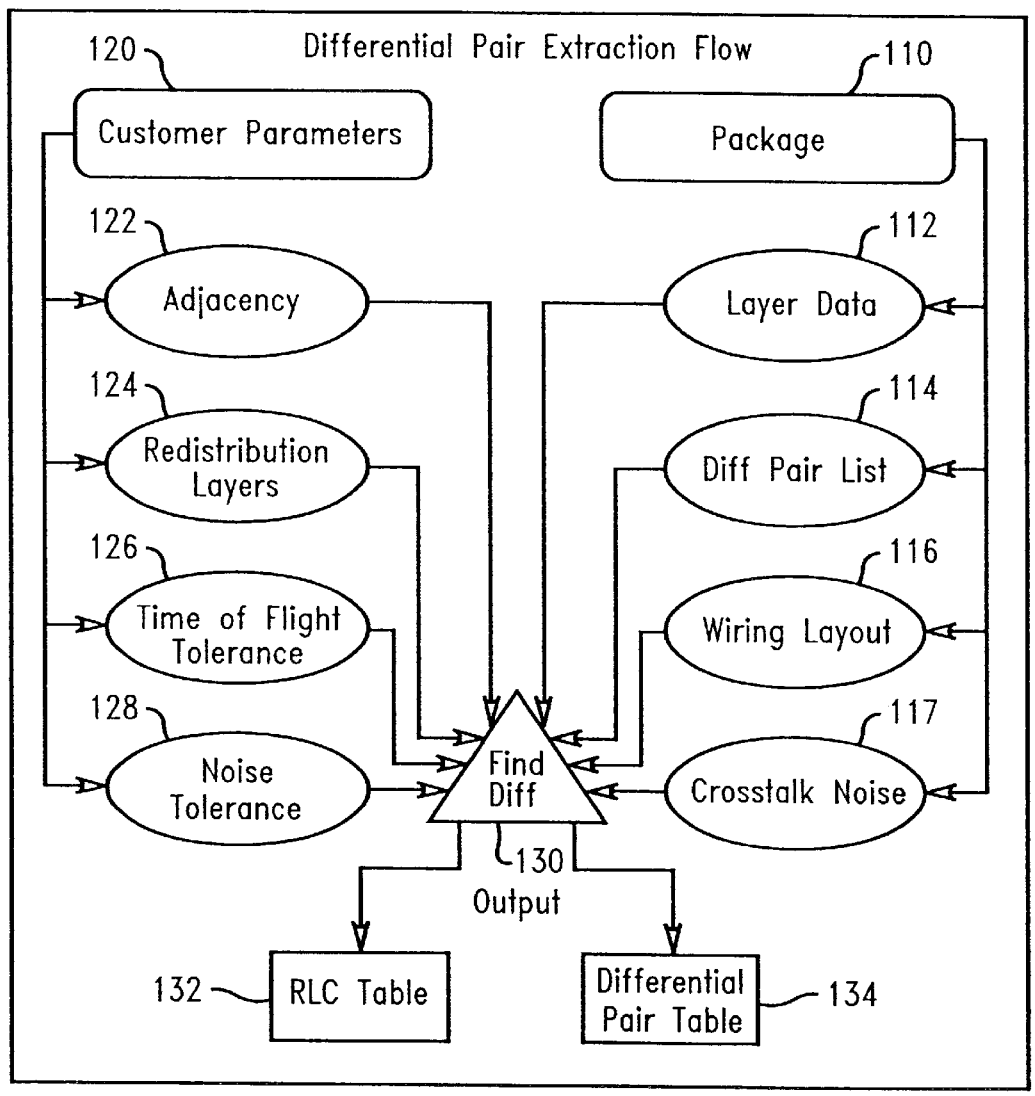
FIG. 6 is a block diagram of the preferred method of specifying, identifying, selecting and verifying differential signal pairs on IC packages.
Figure 7:
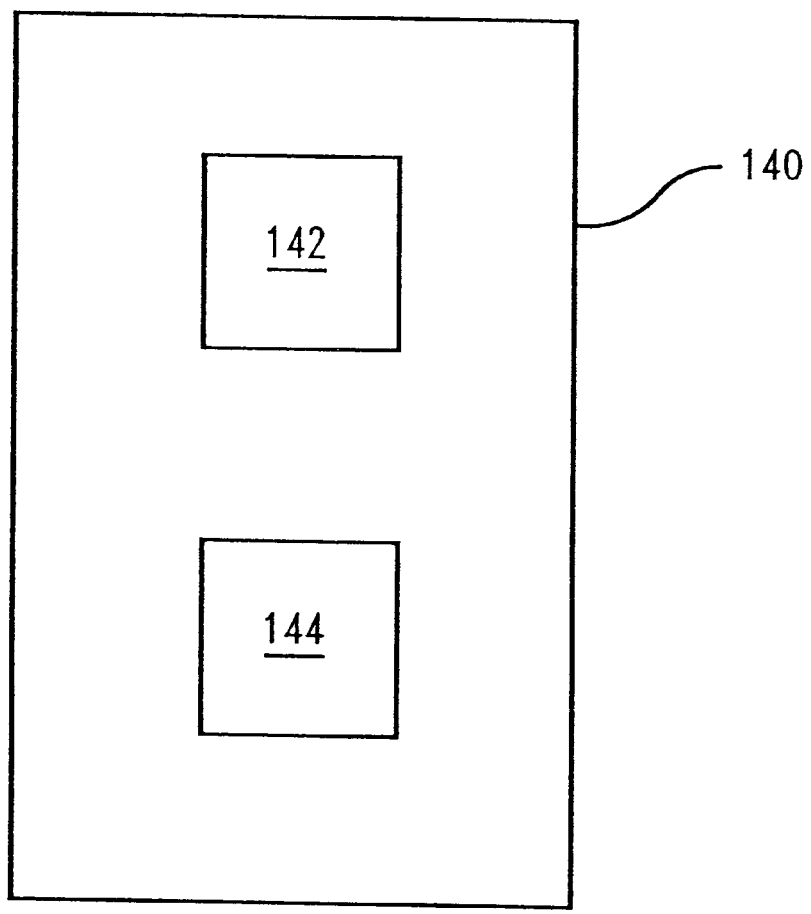
FIG. 7 is a schematic of a computer containing the software to operate the preferred method of the present invention.

FIG. 6 shows the various parameters and data which are used to specify, identify, select and verify differential signal pairs on IC packages. On the right is the fixed physical package information 110 which is determined and considered, including package layer data 112, possible differential pair lists, the package wiring layout, and information on crosstalk noise between different wiring nets in the package. On the left is the customer parameter information 120 which is obtained and considered, including desired predetermined limits on adjacency of on-chip C4s, package via, package redistribution wiring, and package pin, ball and columns for the possible differential pairs 122, desired predetermined limits on which redistribution layers and the voltage references may be utilized 124, desired predetermined time of flight (Tf) tolerances 126 and desired predetermined crosstalk noise tolerances 128. Both the package information 110 and customer parameters 120 are then utilized to determine the differential pairs 130.

In determining the desired differential pair list, the automated method of the present invention may be embodied as a computer program product stored on a program storage device. This program storage device may be devised, made and used as a component of a machine utilizing optics, magnetic properties and/or electronics to perform the method steps of the present invention. Program storage devices include, but are not limited to, magnetic disks or diskettes, magnetic tapes, optical disks, Read Only Memory (ROM), floppy disks, semiconductor chips and the like. A computer readable program code means in known source code may be employed to convert the methods described below for use on a computer. The computer program or software incorporating the process steps and instructions described further below may be stored in any conventional computer, for example, that shown in FIG. 7. Computer 140 incorporates a program storage device 142 and a microprocessor 144. Installed on the program storage device 142 is the program code incorporating the method of the present invention, as well as any database information for the package information 110 and customer parameters 120. After loading the design database for the integrated circuit package, including the physical package information and the customer parameters, the program selects output parameters for the differential pairs comprising, which output parameters include adjacency criteria for the different pairs, time of flight (IRLCTf) tolerances for the differential pairs, and the redistribution layers and their voltage references. For different combinations of pairs of nets available on the IC package, the program comparing the output parameters to the design in the design database, and then determine suitable differential signal pairs, which are obtained by the IC designer. The information provided to the IC designer includes a resistance, inductance and capacitance (RLC) table 132 showing resistance, inductance and capacitance for each differential signal pair determined to be suitable according to the design and customer parameters and a table of the suitable differential pairs 134 (FIG. 6). Differential pair table 134 preferably includes information not only on identification of suitable differential signal pairs, but also differential signal bundles and differential signal groups, as described previously.

As a result of the present invention, there is provided an improved method of selecting differential pairs in computer packages incorporating differential switch logic elements. In addition to automating the design of differential wire pairs in integrated circuit packages, the present invention also provides a method of standardizing criteria for specifying, identifying, selecting and verifying differential signal pairs on IC packages. This may be used to identify particularly desirable differential signal pairs, as well as differential signal bundles and differential signal groups, all with electrical characteristics within a desired range of tolerance, among the various potential signal pairs available in the IC package.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention

What is claimed is:

1. An automated method of selecting differential pairs in an integrated circuit comprising:
   loading a design database for the integrated circuit;
   selecting output parameters for the differential pairs comprising:
      adjacency criteria for the differential pairs,
      time of flight tolerances for the differential pairs,
      total wire length,
      resistance,
      inductance,
      cross talk, and
      redistribution layers and their voltage references;
   comparing the output parameters to design parameters in the design database; and
   obtaining a resulting differential pairs list from said comparison, the differential pair list including differential signal pairs having electrical characteristics within a predetermined design tolerance range.

2. The method of claim 1 wherein the differential pair list includes differential signal pairs having electrical characteristics within a predetermined design tolerance range.

3. The method of claim 2 wherein at least some of the differential signal pairs comprise individual wires or connectors not physically adjacent one another.

4. The method of claim 2 wherein the differential pair list includes bundles of differential signal pairs having electrical characteristics within a predetermined design tolerance range.

5. The method of claim 4 wherein at least some of the differential signal pairs in the bundles are differential signal pairs not physically adjacent one another.

6. The method of claim 4 wherein the differential pair list includes groups of differential signal pairs having electrical characteristics within a predetermined design tolerance range.

7. The method of claim 6 wherein at least some of the differential signal pairs in the groups are bundles of differential signal pairs not physically adjacent one another.

8. The method of claim 1 further including obtaining a table of resistance, inductance and capacitance values of each differential signal pair.

9. An automated method of selecting differential pairs in an integrated circuit, at least some of the differential signal pairs comprising individual wires or connectors not physically adjacent one another, the method comprising:
   loading the design database for the integrated circuit;
   selecting output parameters for the differential pairs comprising:
      adjacency criteria for the different pairs,
      time of flight tolerances for the differential pairs,
      total wire length,
      inductance,
      cross talk, and
      the redistribution layers and their voltage references;
   comparing the output parameters to the design in the design database;
   obtaining a resulting differential pairs list, the differential pair list including differential signal pairs having electrical characteristics within a predetermined design tolerance range.

10. The method of claim 9 wherein the differential pair list includes bundles of differential signal pairs having electrical characteristics within a predetermined design tolerance range.

11. The method of claim 10 wherein at least some of the differential signal pairs in the bundles are differential signal pairs not physically adjacent one another.

12. The method of claim 9 wherein the differential pair list includes groups of differential signal pairs having electrical characteristics within a predetermined design tolerance range.

13. The method of claim 12 wherein at least some of the differential signal pairs in the groups are bundles of differential signal pairs not physically adjacent one another.

14. The method of claim 9 further including obtaining a table of resistance, inductance and capacitance values of each differential signal pair.

15. An article of manufacture comprising a computer usable medium having computer readable program code means embodied therein for selecting differential pairs in an integrated circuit, said article comprising:
   computer readable program code means for loading a design database for the integrated circuit;
   computer readable program code means for selecting output parameters for the differential pairs comprising adjacency criteria for the differential pairs, time of flight tolerances for the differential pairs, total wire length, resistance, inductance, cross talk, and redistribution layers and their voltage references;
   computer readable program code means for comparing the output parameters to design parameters in the design database; and
   computer readable program code means for obtaining a resulting differential pairs list from said comparison, the differential pair list including differential signal pairs having electrical characteristics within a predetermined design tolerance range.

16. A system for selecting differential pairs in an integrated circuit comprising:
   means for loading a design database for the integrated circuit;
   means for selecting output parameters for the differential pairs comprising adjacency criteria for the differential pairs, time of flight tolerances for the differential pairs, total wire length, resistance, inductance, cross talk, and redistribution layers and their voltage references;
   means for comparing the output parameters to design parameters in the design database; and means for obtaining a resulting differential pairs list from said comparison, the differential pair list including differential signal pairs having electrical characteristics within a predetermined design tolerance range.

17. A program storage device readable by a machine, tangibly embodying a program of instructions executable by the machine to perform method steps for selecting differential pairs in an integrated circuit, said method steps comprising;

loading a design database for the integrated circuit;

selecting output parameters for the differential pairs comprising:

adjacency criteria for the differential pairs, time of flight tolerances for the differential pairs, total wire length, resistance, inductance, cross talk, and redistribution layers and their voltage references;

comparing the output parameters to design parameters in the design database; and obtaining a resulting differential pairs list from said comparison, the differential pair list including differential signal pairs having electrical characteristics within a predetermined design tolerance range.

* * * * *